United States Patent
Akashi et al.

(10) Patent No.: US 6,501,583 B1
(45) Date of Patent: Dec. 31, 2002

(54) OPTICAL RECEIVER MODULE OPTICAL TRANSMITTER MODULE PHASE-LOCKED LOOP CIRCUIT VOLTAGE-CONTROLLED OSCILLATOR AND FREQUENCY RESPONSE CONTROLLABLE AMPLIFIER

(75) Inventors: Mitsuo Akashi, Yokohama (JP); Hiroki Irie, Fujisawa (JP); Yasuhiro Yamada, Fujisawa (JP); Akihiro Hayami, Yokohama (JP); Naohiko Baba, Fujisawa (JP); Tomonao Kikuchi, Fujisawa (JP)

(73) Assignee: OpNext Japan, Inc., Yokohama (JP)

( * ) Notice: Subject to any disclaimer, the term of this patent is extended or adjusted under 35 U.S.C. 154(b) by 0 days.

(21) Appl. No.: 09/417,726

(22) Filed: Oct. 14, 1999

(30) Foreign Application Priority Data

Oct. 23, 1998 (JP) ............................................. 10-302125

(51) Int. Cl.[7] .......................... H04B 10/06; H03L 7/00
(52) U.S. Cl. .......................... 359/189; 331/57; 331/23; 331/48
(58) Field of Search ........................... 359/189; 331/57, 331/23, 34, 48, 177 R, 182; 455/17

(56) References Cited

U.S. PATENT DOCUMENTS

| | | | | |
|---|---|---|---|---|
| 4,586,186 A | * | 4/1986 | Anderson | ................. 359/110 |
| 5,412,349 A | * | 5/1995 | Young et al. | ................ 331/1 A |
| 5,652,549 A | * | 7/1997 | Unterricker et al. | .... 331/108 B |
| 5,686,867 A | * | 11/1997 | Sutardja et al. | ......... 331/177 R |
| 6,127,896 A | * | 10/2000 | Burzio | ......................... 331/17 |

FOREIGN PATENT DOCUMENTS

JP           9326676 A      12/1997

* cited by examiner

Primary Examiner—Leslie Pascal
Assistant Examiner—David C Payne

(57) ABSTRACT

Two sets of a high speed differential amplifier and a low speed differential amplifier are prepared, and frequency response speeds of these high speed/low speed differential amplifiers are different from each other. Both an oscillating frequency and a frequency modulation sensitivity of a ring oscillator type voltage-controlled oscillator circuit can be separately set by adding two outputs of these differential amplifiers to each other and by varying the selection ratio of these high speed/low speed differential amplifiers in a linear manner. Thus, the setting ranges for the oscillating frequency and the frequency modulation sensitivity are enlarged. At this time, since a summation of currents flowing through the high speed/low speed differential amplifiers is continuously made constant, the oscillating frequency depending characteristic of the output amplitude of the VCO circuit can be canceled. Furthermore, since control signals are supplied in a differential structure, increasing of jitter components caused by the common mode noise can be suppressed.

16 Claims, 4 Drawing Sheets

OPTICAL RECEIVER MODULE OPTICAL TRANSMITTER MODULE PHASE-LOCKED LOOP CIRCUIT VOLTAGE-CONTROLLED OSCILLATOR AND FREQUENCY RESPONSE CONTROLLABLE AMPLIFIER

BACKGROUND OF THE INVENTION

The present invention is related to a voltage-controlled oscillator circuit (VCO) for constituting a phase-locked loop (PLL) circuit. This phase-locked loop circuit produces a clock signal in synchronism with input data and/or an input clock in an optical transmitter module and an optical receiver module used in an optical communication.

A voltage-controlled oscillator circuit (VCO) for constituting a phase-locked loop (PLL) circuit which produces a clock signal in synchronism with input data and also an input clock, corresponds to such an oscillator. An oscillating frequency of this VCO circuit is varied in response to a control voltage. In general, there are a multivibrator type VCO and a ring oscillator type VCO with respect to a VCO used in an integrated circuit (IC). In the case of a ring oscillator type VCO, since this VCO may be constructed only of transistors and resistors, this ring oscillator type VCO may be manufactured in the form of an IC. Also, in principle, since 4-phase clocks are outputted in which a phase of an oscillator signal is shifted by $\pi/2$, $\pi$, and $3\pi/2$, this ring oscillator type VCO owns the following merit. That is, when a frequency comparator is arranged by employing such a ring oscillator type VCO, a necessary $\pi/2$-delay signal can be produced without employment of an additional circuit.

In FIG. 1, a typical ring oscillator circuit is indicated. An oscillation is initiated by such a way that outputs derived from two-staged differential amplifiers are supplied as inputs to the corresponding differential amplifiers in a positive feedback manner, so that V0, V90, V180, and V270 corresponding to 4-phase clock signals can be obtained. As an item indicative of a characteristic of a VCO circuit, there are an oscillating frequency and a frequency modulation sensitivity. This frequency modulation sensitivity represents a degree of changes in the oscillating frequencies with respect to a control voltage. In this type of system, an oscillating frequency is determined by a transition (cut-off) frequency "$f_T$" of a transistor. In general, a transition frequency of a bipolar type transistor is expressed by the below-mentioned equation (1), assuming now that a collector-to-base capacitance is "Cbc", a base-to-emitter capacitance is "Cbe", and a mutual conductance is "$g_m$":

$$f_T = g_m / 2\pi(C_{bc} + C_{be}) \tag{1}$$

where the values of "Cbc" and "Cbe" depend upon a device fabrication technology. Also, assuming now that an elementary electric charge is "q", a collector current is "Ic", the Boltzmann constant is "k", and an absolute temperature is "T", the mutual conductance "$g_m$" may be expressed by the following equation (2), and is directly proportional to the collector current:

$$g_m = (q \cdot I_c)/(k \cdot T) \tag{2}$$

As a consequence, the oscillating frequency can be controlled by controlling the voltage "Vcont" shown in FIG. 1, and by varying an amount of a current "I1" flowing through the differential amplifier, and this ring oscillator may function as a voltage-controlled oscillator. As apparent from the above-described equation (1), the frequency modulation sensitivity indicative of a change in the oscillating frequencies with respect to a change in the control voltages will depend upon both Cbc and Cbe. Both Cbc and Cbe may be controlled in such a manner that while a plurality of transistors are employed, base, collector, and emitter terminals thereof are connected in parallel to each other. For example, when "n" pieces of transistors are connected in parallel to each other, a collector-to-base capacitance becomes "nCbc" and a base-to-emitter capacitance becomes "nCbe". In this ring oscillator circuit, the parallel element number of the transistors which constitute the differential transistor pairs is varied so as to change these capacitances "Cbc" and "Cbe", so that the frequency modulation sensitivity can be set. Such a system for controlling the oscillating frequency by controlling the currents of the differential transistor pairs is known from, for example, JP-A-9-326676.

In the related ring oscillator type VCO circuit, both Cbc and Cbe are changed by the parallel element number of the transistors of the differential pairs, so that the frequency modulation sensitivity is set. However, these capacitance values Cbc and Cbe are also related to the transition frequency, and therefore may give an adverse influence to the oscillating frequency. To set the oscillating frequency, this oscillating frequency is controllable by the collector current value in accordance with the above-explained equations (1) and (2). In a practical transistor, a range capable of satisfying the above-explained equation (2) is finite, and therefore, a setting width of an oscillating frequency is also finite. As previously explained, in this system, it is practically difficult to set both the oscillating frequency and the frequency modulation sensitivity to desirable values, respectively. In other words, in this VCO circuit, as to the oscillating frequency, the transition frequency "$f_T$" of the transistor is varied by controlling the values of the currents flowing through the differential transistor pairs so as to control the oscillating frequency, whereas as to the frequency modulation sensitivity, this frequency modulation sensitivity is set to a desirable value by varying the capacitance values. However, since the capacitance values are also related to the oscillating frequency, it is practically difficult to design both the oscillating frequency and the frequency modulation sensitivity to the desirable values at the same time.

Also, in the related system, since the frequency of the oscillator is controlled by the values of the currents flowing through the differential pairs, the output amplitude of the oscillator becomes $R \times (I1 + \Delta I)$, assuming now that the resistance values R1 to R4 connected to the differential transistor pairs are equal to "R", and a change amount of currents is "$\Delta I$". As a result, there are such problems that the output amplitude of the oscillator owns the current depending characteristic, and therefore, the phase detection sensitivity at the phase comparator may change due to this behavior.

Furthermore, in the circuit system shown in FIG. 1, when noise is mixed with the current source control voltage Vcont, both the oscillating frequency and the output amplitude are changed, the jitter contained in the output signal are readily increased.

SUMMARY OF THE INVENTION

The present invention has been made to solve the above-described problems, and therefore, has an object to provide a frequency response controllable amplifier, a voltage-controlled oscillator (VCO), and a phase-locked loop (PLL) circuit, capable of increasing a flexibility of design, while enlarging a range for setting an oscillating frequency, and also a range for setting a frequency modulation sensitivity.

Another object of the present invention is to provide a frequency response controllable amplifier, a voltage-controlled oscillator (VCO), and a phase-locked loop (PLL) circuit, capable of increasing a flexibility of design, while enlarging ranges for setting both an oscillating frequency and a frequency modulation sensitivity, and moreover an oscillating frequency depending characteristic of an output amplitude can be canceled.

Another object of the present invention is to provide a frequency response controllable amplifier, a voltage-controlled oscillator (VCO), and a phase-locked loop (PLL) circuit, capable of increasing a flexibility of design, while enlarging ranges for setting both an oscillating frequency and a frequency modulation sensitivity, and moreover suppressing an increase of jitter caused by common mode noise.

A further object of the present invention is to provide a digital optical receiver module and a digital optical transmitter module, in which a phase-locked loop (PLL) circuit can be applied to an optical communication.

To achieve the above-explained objects, a voltage-controlled oscillator, according to an aspect of the present invention, is featured by such a ring oscillator type voltage-controlled oscillator wherein: the ring oscillator type voltage-controlled oscillator is arranged in such a manner that both an oscillating frequency and a frequency modulation sensitivity can be separately set to desirable values.

Also, a voltage-controlled oscillator, according to another aspect of the present invention, is featured by such a ring oscillator type voltage-controlled oscillator comprising: at least two sets of a high speed differential amplifier and a low speed differential amplifier, the frequency response speeds of which are different from each other; and an adder for calculating a summation of outputs of the at least two high speed and low speed differential amplifiers; wherein: a selection ratio of the at least two high speed/low speed differential amplifiers is varied in a linear manner, so that both an oscillating frequency and a frequency modulation sensitivity can be separately set to desirable values, respectively.

Also, in the above-described voltage-controlled oscillator of the present invention, this voltage-controlled oscillator is featured by arranging that while a summation between a current flowing through the high speed differential amplifier and a current flowing through the low speed differential amplifier is made constant, an oscillating frequency depending characteristic of an output amplitude is canceled.

Also, in the above-described voltage-controlled oscillator of the present invention, this voltage-controlled oscillator is featured by arranging that control signals are supplied in a differential structure to at least the two high speed/low speed differential amplifiers.

Also, a voltage-controlled oscillator, according to another aspect of the present invention, is featured by comprising: a first frequency response controllable amplifier equipped with a current source for producing a DC current; a DC current distributer for distributing the DC current of the current source into two DC currents in a ratio depending upon an input control signal; a high speed current distributor in response to an input switching signal; a low speed current distributor in response to the input switching signal; an adder for adding the output from the high speed current distributor to the output from the low speed current distributor; and an output buffer for an output signal from the adder; and a second frequency response controllable amplifier equipped with a current source for producing a DC current; a DC current distributer for distributing the DC current of the current source into two DC currents in a ratio depending upon an input control signal; a high speed current distributor in response to an input switching signal; a low speed current distributor in response to the input switching signal; an adder for adding the output from the high speed current distributor to the output from the low speed current distributor; and an output buffer for output voltage of the adder; wherein: a positive feedback circuit is arranged by using the output signal derived from the first frequency response variable amplifier as an input signal for the second frequency response variable amplifier; and also by using the output signal derived from the second frequency response variable amplifier as an input signal for the first frequency response amplifier.

Also, a phase-looked loop circuit, according to another aspect of the present invention, is featured by comprising the above-explained voltage-controlled oscillator.

Further, a phase-locked loop circuit, according to another aspect of the present invention, is featured by comprising: the above-explained voltage-controlled oscillator; a phase/frequency comparator for comparing phases/frequencies as to the oscillating frequencies outputted from this voltage-controlled oscillator and the entered data; and a loop filter for rejecting high frequency noise from this phase/frequency comparator; wherein a control voltage signal from the loop filter is entered into the above-explained voltage-controlled oscillator.

Also, a digital optical receiver module, according to another aspect of the present invention, is featured by such an optical receiver module arranged by a photodetector for receiving a transmitted optical signal, an amplifier for amplifying the optical signal received by photodetector, and the above-explained phase-locked loop circuit; and in which the optical receiver module is comprised of: a timing extraction circuit for producing and outputting a clock signal in synchronism with a data signal derived from the amplifier; and a decision and regeneration circuit for deciding and regenerating the data signal derived from the amplifier by employing a clock signal derived from the timing extraction circuit.

Moreover, a frequency response controllable amplifier, according to another aspect of the present invention, is featured by comprising: a current source for producing a DC current; a DC current distributer for distributing the DC current of the current source into two DC currents in a ratio depending upon an input control signal; a high speed current distributor in response to an input switching signal; a low speed current distributor in response to the input switching signal; an adder for adding the output from the high speed current distributor to the output from the low speed current distributor; and an output buffer for an output signal from the adder.

As previously described, the ring oscillator type voltage controller, according to the present invention, is arranged in such a manner that the parallel connection number of the transistors is changed; two sets of the high speed/low speed differential amplifiers having the different frequency response speeds from each other are prepared; the output signals derived from the high speed/low speed differential amplifiers are summed; and then the selection ratio of these high speed/low speed differential amplifiers is varied in a linear manner. As a result, both the oscillating frequency and the frequency modulation sensitivity can be separately set. In other words, both the oscillating frequency of the high speed differential amplifier and the oscillating frequency of the low speed differential amplifier are set in such a manner that the desirable oscillating frequency variable ranges can be obtained. The selection ratio of these high speed/low speed differential amplifiers is voltage-controlled so as to set the control sensitivities thereof. As a consequence, the desirable frequency modulation sensitivities can be obtained.

Also, when the high speed differential stage and the low speed differential stage are selectively controlled, since the VCO circuit is arranged in such a manner that the summation of the current flowing through the high speed differential stage and the current flowing through the low speed differential stage is made constant, the oscillating frequency depending characteristic of the output amplitude can be canceled.

Also, since the voltage used to control the oscillating frequency may be applied by the differential arrangement, increasing of the jitter caused by the common mode noise can be suppressed.

BRIEF DESCRIPTION OF THE DRAWINGS

For a better understanding of the present invention, reference is made of a detailed description to be read in conjunction with the accompanying drawings, in which.

DESCRIPTION OF THE EMBODIMENT

Figure 1:
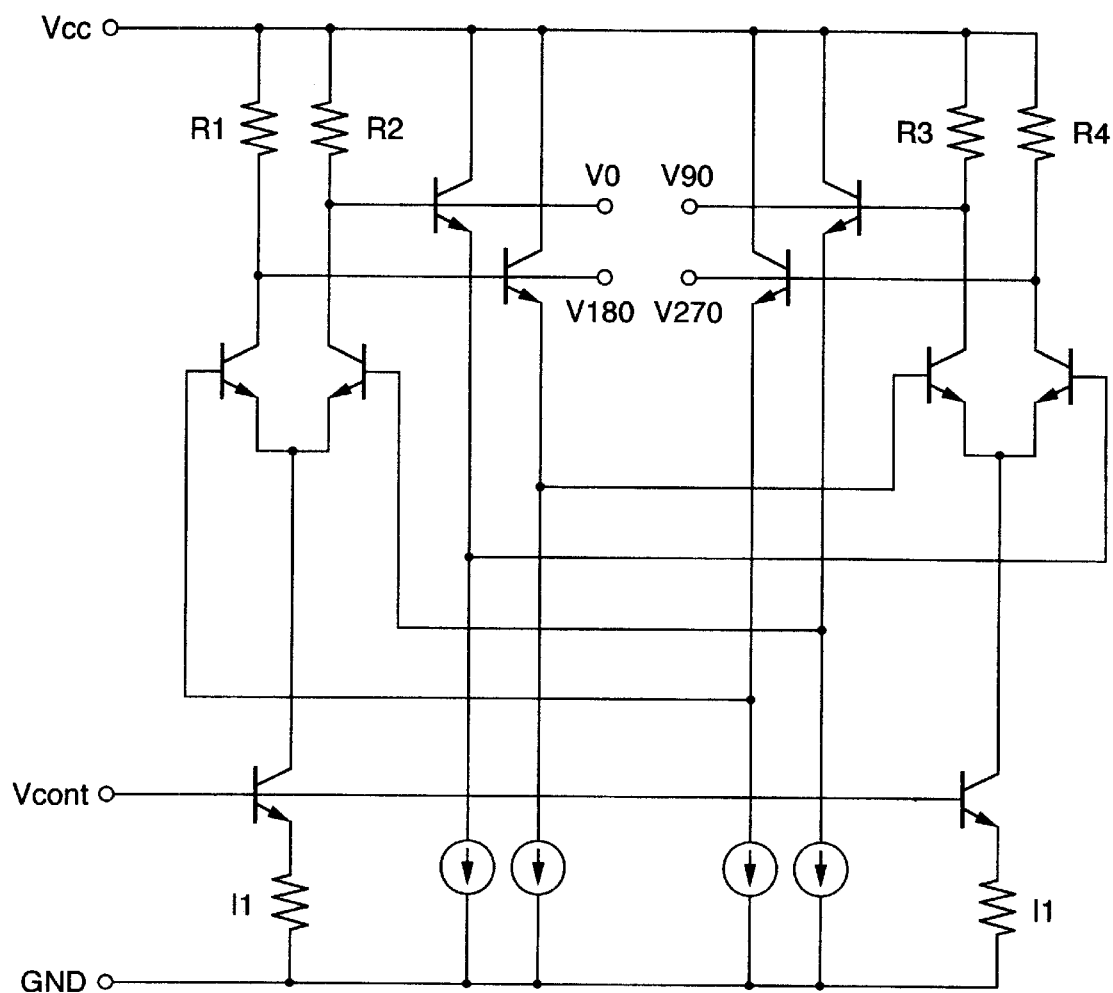
FIG. 1 is a circuit diagram for showing the relevant ring oscillator circuit.
Figure 2:
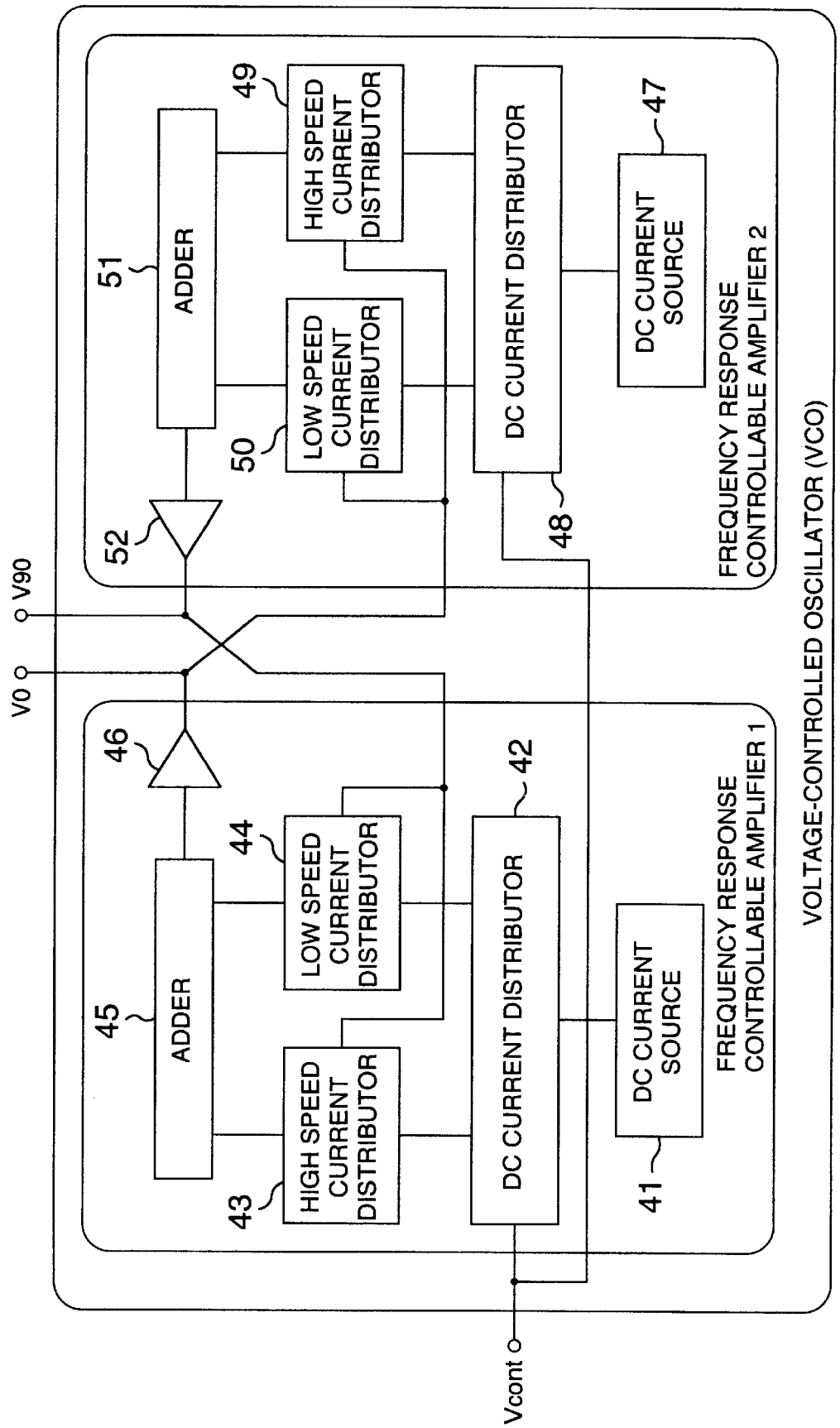
FIG. 2 is a block diagram for representing a ring oscillator type voltage-controlled oscillator (VCO) according to an embodiment of the present invention.

Referring now to drawings, a description will be made of a ring oscillator type voltage-controlled oscillator circuit (VCO circuit); a phase-locked loop (PLL) circuit (timing extraction circuit) which is equipped with this VCO circuit, and is constructed of a single semiconductor chip; and also a digital optical receiver module used in an optical communication and equipped with the timing extraction circuit arranged by this PLL circuit.

First, a ring oscillator type voltage-controlled oscillator circuit (VCO circuit) according to an embodiment of the present invention will now be described in detail.

This ring oscillator type voltage-controlled oscillator circuit is arranged as follows: First, a frequency response controllable amplifier 1 is constituted by that at least two sets of a high speed current distributor 43 and a low speed current distributor 44 are prepared, the frequency response speeds of which are different from each other. A DC current distributor 42 controlled by a voltage of "Vcont" is employed so as to vary a current ratio of a current flowing through the low speed current distributor 43 to a current flowing through the high speed current distributor 44. A summation of the currents flowing through the respective current distributors 43 and 44 becomes continuously constat by way of a DC current source 41. Then, an output signal from the high speed current distributor 43 is added to an output signal from the low speed current distributor 44 by an adder 45, and the added signal is outputted via an output buffer 46.

Similarly, another frequency response controllable amplifier 2 is constituted by that at least two sets of a high speed current distributor 49 and a low speed current distributor 50 are prepared, the frequency response speeds of which are different from each other. A DC current distributor 48 controlled by the voltage of Vcont is employed so as to vary a current ratio of a current flowing through the low speed current distributor 49 to a current flowing through the high speed current distributor 50. A summation of the currents flowing through the respective current distributors 49 and 50 becomes continuously constat by way of the DC current source 41. Then, an output signal from the high speed current distributor 49 is added to an output signal from the low speed current distributor 50 by an adder 51, and the added signal is outputted via an output buffer 52. As explained above, while another frequency response controllable amplifier 2 having the same arrangement as that of the frequency response controllable amplifier 1 is prepared, the respective outputs V0 and V90 of these frequency response controllable amplifiers 1 and 2 are entered into the opposite current distributors 49/50 and 43/44 in a positive feedback manner, so that these frequency response controllable amplifiers 1 and 2 are operated as the voltage-controlled oscillator (VCO) circuit.

Figure 3:
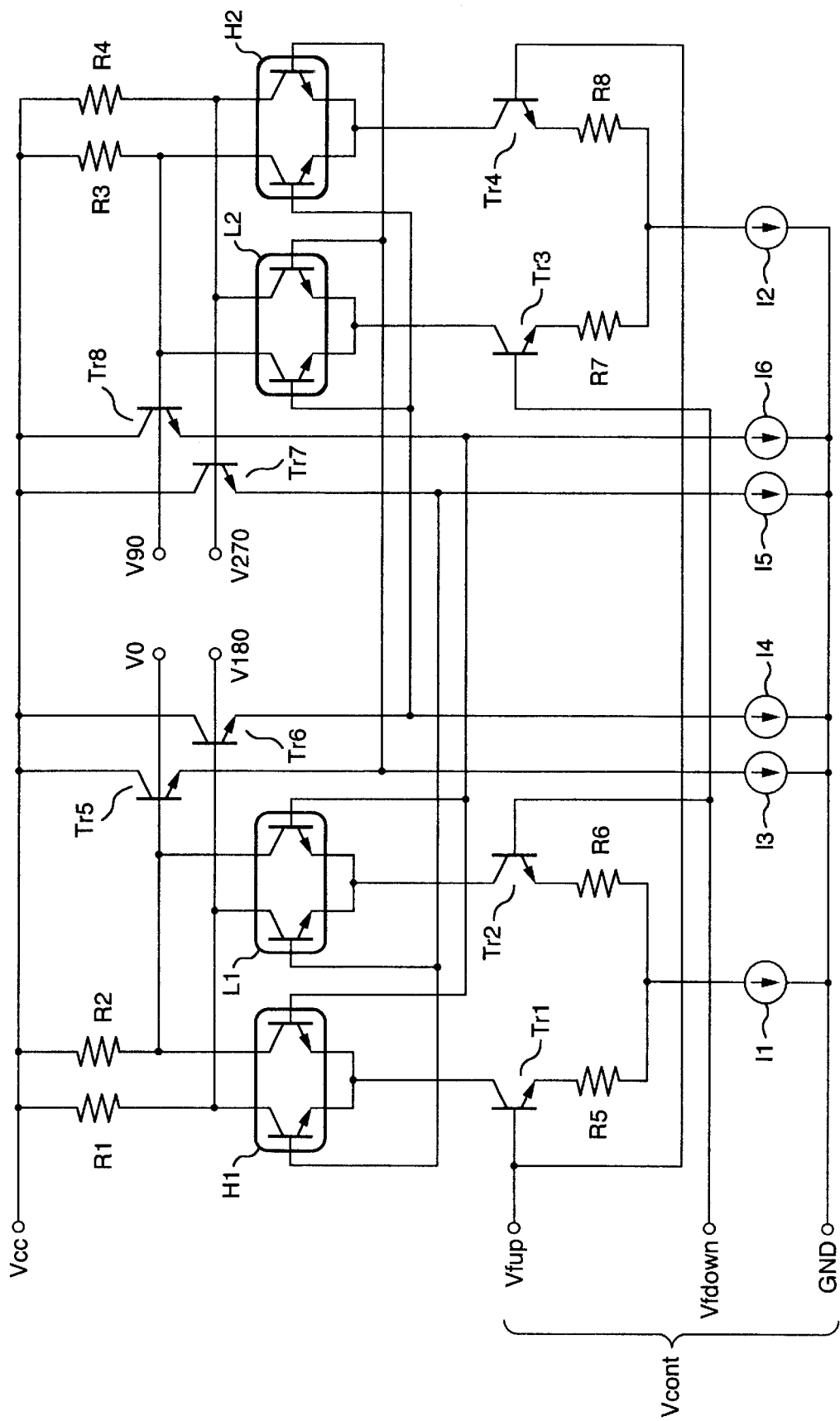
FIG. 3 indicates a concrete circuit arrangement of the voltage-controlled oscillator according to the embodiment of the present invention.

FIG. 3 is a circuit diagram for showing an embodied example of the above-described ring oscillator type voltage-controlled oscillator circuit. In this VCO circuit, at least two sets of high speed differential stages and low speed differential stages H1, L1; H2, L2 are prepared, the frequency response speeds of which are different from each other. Also, parallel connection numbers of transistors of these differential stages Hi, L1; H2, L2 are different from each other. The output signals derived from these high speed/low speed differential stages HI, L1; H2, L2 are summed to each other (namely, with respect to Vcc, collectors of transistors for constituting respective high speed/low speed differential stages H1, L1; H2, L2 are connected by resistors R1 to R4). At this stage, while a summation of currents flowing through the high speed differential stage and the low speed differential stage becomes constant, values of the currents flowing through the respective differential stages are varied in a linear manner by base voltages (Vfup and Vfdown shown in FIG. 3) of differential transistor pairs Tr1, Tr2; Tr4, Tr3 provided at lower stages of the respective differential stages, and the high speed differential stage and the low speed differential stage are selected. As a result, the oscillation frequency of the VCO circuit can be controlled. Assuming now that capacitance values of transistors of the high speed and low speed differential stages H1, L1; H2, L2 are set as (Cbc1+Cbe1) and (Cbc2+Cbe2), transition frequencies "$f_T1$" and "$f_T2$" of the respective transistors are expressed by the below-mentioned equations 3 and 4, and the oscillating frequency of the VCO circuit can be controlled in a linear manner between the oscillating frequency of the high speed differential stage and the oscillating frequency of the low speed differential stages. It should be understood that symbol "Cbc" indicates a collector-to-base capacitance of a transistor, symbol "Cbe" shows a base-to-emitter capacitance of a transistor, and symbol "$g_m$" represents a mutual conductance:

$$f_T1 = g_m/2\pi(C_{bc1}+C_{be1}) \qquad (3)$$

and $$f_T2 = g_m/2\pi(C_{bc2}+C_{be2}) \qquad (4)$$

Also, as to a frequency modulation sensitivity, in the differential transistor pairs Tr1, Tr2; Tr4, Tr3 for selecting the high speed differential stage and the low speed differential stage, resistors R5 to R8 are additionally provided between emitter coupling, so that a voltage control sensitivity can be set and thus a desirable frequency modulation sensitivity can be obtained.

As previously explained, in the case that both the oscillating frequency and the frequency modulation sensitivity are designed, first of all, the capacitance values of both the high speed differential stage and the low speed differential stage are determined based on a desirable oscillating frequency range, and the parallel connection number of the transistors is determined. As to the frequency modulation sensitivity, since the voltage control sensitivity of the selection ratio for the high speed differential stage and the low speed differential stage is set, both the oscillating frequency and the frequency modulation sensitivity can be separately set.

Also, since the constant current sources I1; I2 are used in such a manner that the summation of the current flowing through the high speed differential stage and also the current flowing through the low speed differential stage becomes constant, even when the oscillating frequency is controlled, the output amplitude is continuously equal to R×I, and therefore, there is no oscillating frequency depending characteristic of the output amplitude.

Further, since the voltage for controlling the oscillating frequency may be applied by the differential circuit arrangement according to this embodiment system, increasing of the jitter caused by the common mode noise can be suppressed.

It should also be noted that the respective transistors Tr5, Tr6, Tr7, and Tr8 constitute the output buffers 46 and 52. Furthermore, each of I3 to I6 is a constant current source which is connected to an emitter of each of the transistors Tr5, Tr6, Tr7, and Tr8.

Figure 4:
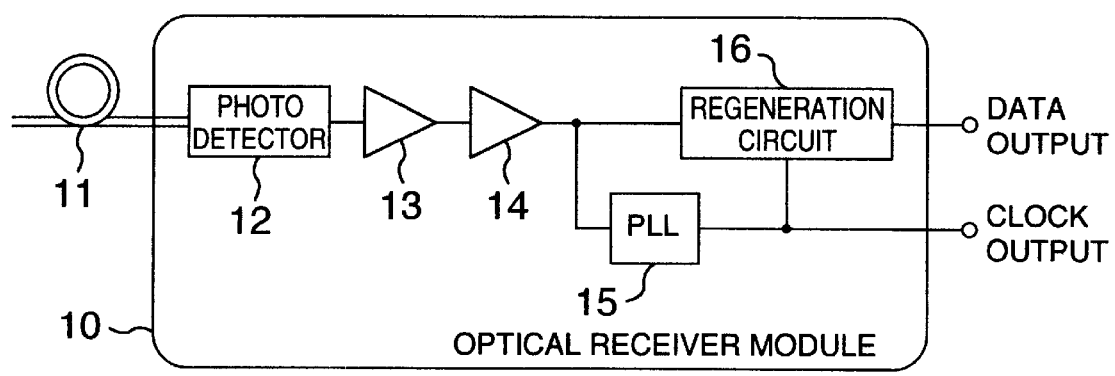
FIG. 4 is a schematic block diagram for showing an arrangement of an optical receiver module according to the present invention.
Figure 5:
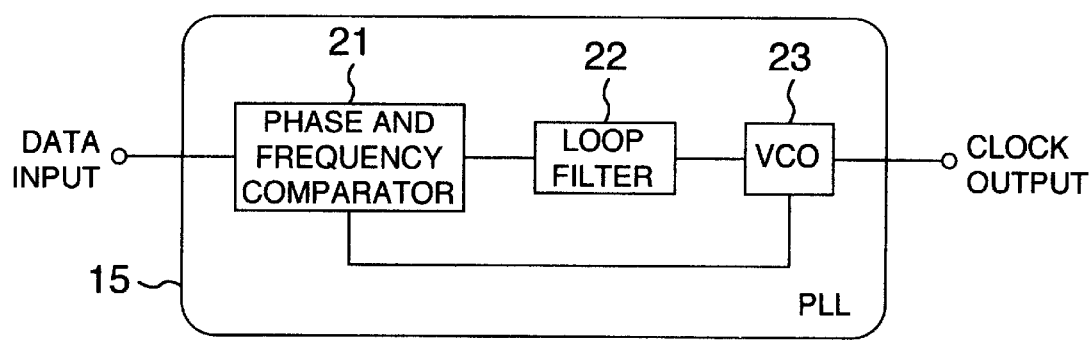
FIG. 5 is a schematic block diagram for indicating an arrangement of a phase-blocked loop (PLL) circuit according to the present invention.

Next, referring now to FIG. 4 and FIG. 5, a description is made of a phase-locked loop (PLL) circuit (timing extraction circuit) 15, and a digital optical receiver module 10. This PLL circuit 15 is equipped with the above-described ring oscillator type voltage-controlled oscillator circuit (VCO circuit) 23, and is constituted by a single semiconductor chip. The digital optical receiver module 10 is equipped with the timing extraction circuit 15 arranged by this PLL circuit 15, and is utilized in an optical communication.

As indicated in FIG. 5, the phase-locked loop (PLL) circuit 15 is arranged by the voltage-controlled oscillator (VCO) 23, a phase and frequency comparator 21, and a loop filter 22. The VCO 23 corresponds to such an oscillator, the oscillating frequency of which is varied by the control voltage, and the oscillating frequency outputted from this VCO 23 is fed back to the phase/frequency comparator 21. In other words, the phase-locked loop (PLL) circuit 15 contains the voltage-controlled oscillator 23; the phase/frequency comparator 21 for comparing phases and frequencies with respect to the oscillating frequencies outputted from this voltage-controlled oscillator 23 and the entered data; and the loop filter 22 for rejecting a high frequency noise from the control voltage signal outputted from this phase/frequency comparator 21. Then, this phase-locked loop circuit 15 is arranged in such a way that a control voltage signal derived from this loop filter 22 is entered into the above-explained voltage-controlled oscillator 23.

As indicated in FIG. 4, the digital optical module 10 which is equipped with the timing extraction circuit 15 constituted by the PLL circuit 15 and is used in the optical communication is arranged by a photodetector 12, a pre-amplifier 13, a post-amplifier 14, the timing extraction circuit 15, and a decision and regeneration circuit 16. In an optical fiber communication, an optical signal transmitted from an optical transmitter module is transferred to the optical receiver module 10 while using an optical fiber 11, and then is converted into an original electric signal by the optical receiver module 10. In other words, the optical receiver module 10 is constituted by the photodetector 12 for receiving the transmitted optical signal, the amplifiers 13 and 14 for amplifying the signal received by this photodetector 12, the above-explained phase-locked loop circuit 15, the timing extraction circuit 15, and also the decision and regeneration circuit 16. The timing extraction circuit 15 produces a clock signal, and this clock signal is synthesized with the data signal acquired by the amplifier 14. The decision and regeneration circuit 16 decides/regenerates the data signal acquired from the amplifier 14 by employing the clock signal obtained from the timing extracting circuit 15 to thereby output the regenerated data signal. As a consequence, both the timing extraction circuit 15 and the decision/regeneration circuit 16 produce the clock signal in synchronism with the input data, and decide/regenerate the input signal with employment of this produced clock signal. The timing extract circuit and the decision/regeneration circuit can be fabricated in an integrated circuit by using the phase-locked loop (PLL) technique, so that the digital optical receiver module 10 can be made compact and in low cost.

Subsequently, a digital optical transmitter module will now be explained.

One of major objects to use the phase-locked loop (PLL) circuit according to the present invention in the digital optical transmitter module is to correct distortion of a pulse width.

In such a case that only data signal to be transmitted is applied to the digital optical transmitter module, there are provided a phase-locked loop circuit having a similar circuit arrangement to that of the above-explained optical receiver module, an optical device driver circuit, and a flip-flop circuit at a prestage of this optical device driver circuit. Both the data signal and the clock extracted from the output signal of the phase-locked loop circuit are inputted to the flip-flop circuit, and then an output signal from the flip-flop circuit is entered into the optical device drive circuit. As a result, even when the data signal contains the pulse width distortion to some extent, the pulse width distortion can be corrected by using the extracted clock.

Another major object to use the phase-locked loop (PLL) circuit according to the present invention is to suppress a jitter.

In the case that both a clock signal and a data signal to be transmitted are supplied to the optical transmitter module, when this optical transmitter module is arranged by employing a similar arrangement to that for processing the clock signal, even if the clock signal contains the jitter to some extent, this optical transmitter module can suppress this jitter by using the flip-flop circuit and the extracted clock.

As another application example of the digital optical transmitter module, the following optical transmitter module is conceivable. While both a data signal to be transmitted and a clock signal are applied to such an optical transmitter module, a code conversion circuit is employed, and another clock signal two times higher than the first-mentioned clock signal is required for the code conversion. If one set of a prescaler circuit is provided in a circuit loop defined from a voltage-controlled oscillator (VCO) to a phase/frequency comparator, then a clock signal having a clock frequency two times higher than that of the first-mentioned clock signal can be obtained. As this application example, for instance, the CMI (Coded Mark Inversion) code for requiring the twice frequency clock signal in the coding/decoding operation is conceivable. In accordance with the application example, other desirable clocks can be extracted. Alternatively, the twice frequency clock signal may be employed not only in the optical transmitter module, but also may be used in the decoder circuit of the optical receiver module.

It should be understood that the operating speeds which can be applied to the above-explained technique according to the present invention are very wide from the Low speed system defined by ITU-T (International Telecommunication Union-Telecommunication Standardization Sector) up to the high speed system. In particular, the technique according to the present invention may be advantageously applied to the layers of STM-4 (622.08 Mbit/s) and STM-16 (2.48832 Gbit/s). Apparently, this present technique may be employed even in other operating speeds.

In accordance with the present invention, the below-mentioned effects can be achieved. That is, both the oscillating frequency and the frequency modulation sensitivity can be separately set. The setting ranges of the respective oscillating frequency and frequency modulation sensitivity can be effectively enlarged. As the voltage-controlled oscillator (VCO), and further-more, as the phase-locked loop (PLL) circuit, a flexibility of designing of these circuits can be increased.

Also, in accordance with the system of the present invention, when the high speed differential stage and the low speed differential stage are selectively controlled, since the VCO circuit is arranged in such a manner that the summation of the current flowing through the high speed differential stage and the current flowing through the low speed differential stage is made constant, the oscillating frequency depending characteristic of the output amplitude can be canceled.

Also, in accordance with the system of the present invention, since the voltage used to control the oscillating frequency may be applied by the differential arrangement, increasing of the jitter component caused by the common mode noise can be suppressed.

Furthermore, in accordance with the system of the present invention, since both the timing extraction circuit and the decision/regeneration circuit with employment of the phase-locked loop (PLL) technique can be manufactured in the IC form, the digital optical transmitter module and the digital optical receiver module can be made compact and in low cost.

What is claimed is:

1. A ring oscillator type voltage-controlled oscillator comprising:
   at least two sets of a high speed differential amplifier and a low speed differential amplifier, the frequency response speeds of which are different from each other; and
   an adder for calculating a summation of outputs of said at least two high speed and low speed differential amplifiers; wherein:
      a selection ratio of said at least two high speed/low speed differential amplifiers is varied in a linear manner, so that both an oscillating frequency and a frequency modulation sensitivity can be separately set to desirable values, respectively.

2. A ring oscillator type voltage-controlled oscillator comprising:
   at least two sets of a high speed differential amplifier and a low speed differential amplifier, the frequency response speeds of which are different from each other; and
   an adder for calculating a summation of outputs of said at least two high speed and low speed differential amplifiers; wherein:
      a selection ratio of said at least two high speed/low speed differential amplifiers is varied in a linear manner, so that both an oscillating frequency and a frequency modulation sensitivity can be separately set to desirable values, respectively; and
      while a summation between a current flowing through said high speed differential amplifier and a current flowing through said low speed differential amplifier is made constant, an oscillating frequency depending characteristic of an output amplitude is canceled.

3. A ring oscillator type voltage-controlled oscillator comprising:
   at least two sets of a high speed differential amplifier and a low speed differential amplifier, the frequency response speeds of which are different from each other; and
   an adder for calculating a summation of outputs of said at least two high speed and low speed differential amplifiers; wherein:
      a selection ratio of said at least two high speed/low speed differential amplifiers is varied in a linear manner, so that both an oscillating frequency and a frequency modulation sensitivity can be separately set to desirable values, respectively; and
      control signals are supplied in a differential structure to at least said two high speed/low speed differential amplifiers.

4. A ring oscillator type voltage-controlled oscillator comprising:
   at least two sets of a high speed differential amplifier and a low speed differential amplifier, the frequency response speeds of which are different from each other; and
   an adder for calculating a summation of outputs of said at least two high speed and low speed differential amplifiers; wherein:
      a selection ratio of said at least two high speed/low speed differential amplifiers is varied in a linear manner, so that both an oscillating frequency and a frequency modulation sensitivity can be separately set to desirable values, respectively;
      while a summation between a current flowing through said high speed differential amplifier and a current flowing through said low speed differential amplifier is made constant, an oscillating frequency depending characteristic of an output amplitude is canceled; and
      control signals are supplied in a differential structure to at least said two high speed/low speed differential amplifiers.

5. A voltage-controlled oscillator comprising:
   a first frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; and a second frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; wherein:

a positive feedback circuit is arranged by using the output signal derived from said first frequency response variable amplifier as an input signal for said second frequency response variable amplifier; and also by using the output signal derived from said second frequency response variable amplifier as an input signal for said first frequency response amplifier.

6. A phase-locked loop circuit comprising:

a ring oscillator type voltage-controlled oscillator including:

at least two sets of a high speed differential amplifier and a low speed differential amplifier, the frequency response speeds of which are different from each other; and an adder for calculating a summation of outputs of said at least two high speed and low speed differential amplifiers; wherein:

a selection ratio of said at least two high speed/low speed differential amplifiers is varied in a linear manner, so that both an oscillating frequency and a frequency modulation sensitivity can be separately set to desirable values, respectively.

7. A phase-locked loop circuit comprising:

a ring oscillator type voltage-controlled oscillator including:

at least two sets of a high speed differential amplifier and a low speed differential amplifier, the frequency response speeds of which are different from each other; and an adder for calculating a summation of outputs of said at least two high speed and low speed differential amplifiers; wherein:

a selection ratio of said at least two high speed/low speed differential amplifiers is varied in a linear manner, so that both an oscillating frequency and a frequency modulation sensitivity can be separately set to desirable values, respectively; and while a summation between a current flowing through said high speed differential amplifier and a current flowing through said low speed differential amplifier is made constant, an oscillating frequency depending characteristic of an output amplitude is canceled.

8. A phase-locked loop circuit comprising:

a ring oscillator type voltage-controlled oscillator including:

at least two sets of a high speed differential amplifier and a low speed differential amplifier, the frequency response speeds of which are different from each other; and an adder for calculating a summation of outputs of said at least two high speed and low speed differential amplifiers; wherein:

a selection ratio of said at least two high speed/low speed differential amplifiers is varied in a linear manner, so that both an oscillating frequency and a frequency modulation sensitivity can be separately set to desirable values, respectively; and control signals are supplied in a differential structure to at least said two high speed/low speed differential amplifiers.

9. A phase-locked loop circuit comprising:

a ring oscillator type voltage-controlled oscillator including:

at least two sets of a high speed differential amplifier and a low speed differential amplifier, the frequency response speeds of which are different from each other; and an adder for calculating a summation of outputs of said at least two high speed and low speed differential amplifiers; wherein:

a selection ratio of said at least two high speed/low speed differential amplifiers is varied in a linear manner, so that both an oscillating frequency and a frequency modulation sensitivity can be separately set to desirable values, respectively;

while a summation between a current flowing through said high speed differential amplifier and a current flowing through said low speed differential amplifier is made constant, an oscillating frequency depending characteristic of an output amplitude is canceled; and control signals are supplied in a differential structure to at least said two high speed/low speed differential amplifiers.

10. A phase-locked loop circuit comprising:

a voltage-controlled oscillator including:

a first frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; and a second frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; wherein:

a positive feedback circuit is arranged by using the output signal derived from said first frequency response variable amplifier as an input signal for said second frequency response variable amplifier; and also by using the output signal derived from said second frequency response variable amplifier as an input signal for said first frequency response amplifier.

11. An optical receiver module wherein:

said optical receiver module is arranged by a phase-locked loop circuit including a photodetector for receiving a transmitted optical signal, an amplifier for amplifying the optical signal received by said photodetector, and a ring oscillator type voltage-controlled oscillator including: at least two sets of a high speed differential amplifier and a low speed differential amplifier, the frequency response speeds of which are different from each other; and an adder for calculating a summation of outputs of said at least two high speed and low speed differential amplifiers; in which a selection ratio of said at least two high speed/low speed differential amplifiers is varied in a linear manner, so that both an oscillating frequency and a frequency modulation sensitivity can be separately set to desirable values, respectively; and said optical receiver module is comprised of: a timing extraction circuit for producing and outputting a clock signal in synchronism with a data signal derived from said amplifier; and a decision and regeneration circuit for deciding and regenerating the data signal derived from said amplifier by employing a clock signal derived from said timing extraction circuit.

12. An optical receiver module wherein:

said optical receiver module is arranged by a phase-locked loop circuit including a photodetector for receiving a transmitted optical signal, an amplifier for amplifying the optical signal received by said photodetector, and a ring oscillator type voltage-controlled oscillator including: at least two sets of a high speed differential amplifier and a low speed differential amplifier, the frequency response speeds of which are different from each other; and an adder for calculating a summation of outputs of said at least two high speed and low speed differential amplifiers; in which a selection ratio of said at least two high speed/low speed differential amplifiers is varied in a linear manner, so that both an oscillating frequency and a frequency modulation sensitivity can be separately set to desirable values, respectively; and while a summation between a current flowing through said high speed differential amplifier and a current flowing through said low speed differential amplifier is made constant, an oscillating frequency depending characteristic of an output amplitude is canceled; and said optical receiver module is comprised of: a timing extraction circuit for producing and outputting a clock signal in synchronism with a data signal derived from said amplifier; and a decision and regeneration circuit for deciding and regenerating the data signal derived from said amplifier by employing a clock signal derived from said timing extraction circuit.

13. An optical receiver module wherein:

said optical receiver module is arranged by a phase-locked loop circuit including a photodetector for receiving a transmitted optical signal, an amplifier for amplifying the optical signal received by said photodetector, and a ring oscillator type voltage-controlled oscillator including: at least two sets of a high speed differential amplifier and a low speed differential amplifier, the frequency response speeds of which are different from each other; and an adder for calculating a summation of outputs of said at least two high speed and low speed differential amplifiers; in which a selection ratio of said at least two high speed/low speed differential amplifiers is varied in a linear manner, so that both an oscillating frequency and a frequency modulation sensitivity can be separately set to desirable values, respectively; and control signals are supplied in a differential structure to at least said two high speed/low speed differential amplifiers; and said optical receiver module comprises: a timing extraction circuit for producing and outputting a clock signal in synchronism with a data signal derived from said amplifier; and a decision and regeneration circuit for deciding and regenerating the data signal derived from said amplifier by employing a clock signal derived from said timing extraction circuit.

14. An optical receiver module wherein:

said optical receiver module is arranged by a phase-locked loop circuit including a photodetector for receiving a transmitted optical signal, an amplifier for amplifying the optical signal received by said photodetector, and a ring oscillator type voltage-controlled oscillator including: at least two sets of a high speed differential amplifier and a low speed differential amplifier, the frequency response speeds of which are different from each other; and an adder for calculating a summation of outputs of said at least two high speed and low speed differential amplifiers; in which a selection ratio of said at least two high speed/low speed differential amplifiers is varied in a linear manner, so that both an oscillating frequency and a frequency modulation sensitivity can be separately set to desirable values, respectively; while a summation between a current flowing through said high speed differential amplifier and a current flowing through said low speed differential amplifier is made constant, an oscillating frequency depending characteristic of an output amplitude is canceled; and control signals are supplied in a differential structure to at least said two high speed/low speed differential amplifiers; and said optical receiver module comprises: a timing extraction circuit for producing and outputting a clock signal in synchronism with a data signal derived from said amplifier; and a decision and regeneration circuit for deciding and regenerating the data signal derived from said amplifier by employing a clock signal derived from said timing extraction circuit.

15. An optical receiver module wherein:

said optical receiver module is arranged by a phase-locked loop circuit including a photodetector for receiving a transmitted optical signal, an amplifier for amplifying the optical signal received by said photodetector, and a ring oscillator type voltage-controlled oscillator including: a first frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; and a second frequency response controllable amplifier equipped with a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage; in which:

a positive feedback circuit is arranged by using the output signal derived from said first frequency response variable amplifier as an input signal for said second frequency response variable amplifier; and also by using the output signal derived from said second frequency response variable amplifier as an input signal for said first frequency response amplifier; and said optical receiver module comprises: a timing extraction circuit for producing and outputting a clock signal in synchronism with a data signal derived from said amplifier; and a decision and regeneration circuit for deciding and regenerating the data signal derived from said amplifier by employing a clock signal derived from said timing extraction circuit.

16. A frequency response controllable amplifier comprising:

a current source for producing a DC current; a DC current distributer for distributing the DC current of said current source into two DC currents in a ratio depending upon an input distribution signal; a high speed current distributor for distributing one current of the output currents distributed by said DC current distributor in a high speed in response to an input switching signal; a low speed current distributor for distributing the other current of said output currents distributed by said DC current distributor in a low speed in response to the input switching signal; an adder for adding the output from said high speed current distributor to the output from said low speed current distributor; and an output buffer for receiving an output voltage of said adder to output the buffered output voltage.

* * * * *